(12) United States Patent
Marsili et al.

(10) Patent No.: US 7,940,830 B2
(45) Date of Patent: May 10, 2011

(54) FAST HOPPING FREQUENCY SYNTHESIZER

(75) Inventors: Stefano Marsili, Spittal/Drau (AT); Marc Tiebout, Wessling (DE); Andrea Bevilacqua, Vicenza (IT); Stefano Dal Toso, Montegalda (IT)

(73) Assignee: Infineon Technologies AG, Munich (DE)

( * ) Notice: Subject to any disclaimer, the term of this patent is extended or adjusted under 35 U.S.C. 154(b) by 751 days.

(21) Appl. No.: 11/863,037

(22) Filed: Sep. 27, 2007

(65) Prior Publication Data

US 2009/0088113 A1 Apr. 2, 2009

(51) Int. Cl.
*H04B 1/00* (2006.01)

(52) U.S. Cl. ........ 375/134; 375/132; 375/133; 375/306; 331/46; 331/53; 331/56

(58) Field of Classification Search .......... 375/132–134, 375/306; 331/46, 53, 56
See application file for complete search history.

(56) References Cited

U.S. PATENT DOCUMENTS

| | | | | |
|---|---|---|---|---|
| 5,422,594 | A | * | 6/1995 | Liao et al. ............... 327/120 |
| 7,046,098 | B2 | | 5/2006 | Staszewski |
| 2003/0189466 | A1 | * | 10/2003 | Kitamura ............... 331/100 |
| 2005/0249265 | A1 | | 11/2005 | Shoji et al. |
| 2005/0264367 | A1 | | 12/2005 | Munker et al. |
| 2006/0244501 | A1 | * | 11/2006 | Foerster et al. ........... 327/207 |
| 2006/0256910 | A1 | | 11/2006 | Tal et al. |
| 2007/0159259 | A1 | * | 7/2007 | Suh et al. .................. 331/2 |
| 2007/0184803 | A1 | * | 8/2007 | Aytur ...................... 455/296 |
| 2007/0213019 | A1 | * | 9/2007 | Devries et al. ............ 455/130 |
| 2008/0056337 | A1 | * | 3/2008 | Tal et al. .................. 375/219 |

OTHER PUBLICATIONS

Wolaver, D.H., "Phase-Locked Loop Circuit Design," ISBN: 0-13-662743-9, 1991, pp. 1-2, Prentice-Hall Inc., Englewood Cliffs, New Jersey.
Kudszus, S., "W-Band HEMT-Oscillator with Stabilization by Phase Controlled Subharmonic Injection Locking," 29th European Microwave Conference, Oct. 1999, pp. 198-201, vol. 1.
Wolaver, D.H., "Phase-Locked Loop Circuit Design," ISBN: 0-13-662743-9, 1991, pp. 97-100, Prentice-Hall Inc., Englewood Cliffs, New Jersey.
Vancorenland, P., et al., "A 1.57 GHz Fully Integrated Very Low Phase Noise Quadrature VCO," Symposium on VLSI Circuits, Digest of Technical Papers, Jun. 14-16, 2001, pp. 111-114, Kyoto, Japan.
Shenggao, L., et al., "A 10-GHz CMOS Quadrature LC-VCO for Multirate Optical Applications," IEEE Journal of Solid-State Circuits, Oct. 2003, pp. 1626-1634, vol. 38, No. 10, IEEE.
Sandner, C., et al., "A WiMedia/MBOA-Complaint CMOS RF Transceiver for UWB," IEEE International Solid-State Circuits Conference, ISSCC Session 6, Feb. 6-9, 2006, pp. 408-417, San Francisco, California.

(Continued)

*Primary Examiner* — Curtis B Odom
(74) *Attorney, Agent, or Firm* — Slater & Matsil, L.L.P.

(57) ABSTRACT

Apparatus and systems for synthesizing frequencies for use in a fast hopping wireless communications system. A frequency synthesizer comprises a plurality of oscillators with each oscillator having a first input coupled to a reference clock frequency signal, and a signal selector having a control signal input and a plurality of reference clock inputs with each reference clock input coupled to an output from an oscillator. Each oscillator produces a reference frequency that is a harmonic of a reference clock frequency of the reference clock frequency signal, and the signal selector couples a reference clock input to an output based on a control signal provided by the control signal input.

18 Claims, 5 Drawing Sheets

OTHER PUBLICATIONS

Tanaka, A., et al., "A 1.1V 3.1-to-9.5GHz MB-OFDM UWB Transceiver in 90nm CMOS," IEEE International Solid-State Circuits Conference, Digest of Technical Papers, ISSCC Session 6, Feb. 6-9, 2006, pp. 398-407, San Francisco, California.

Da Dalt, N., et al., "A 10GHz Digitally Controlled LC Oscillator in 65nm CMOS," 2006 IEEE International Solid-State Circuits Conference, Session 10: mm-Wave and Beyond, Feb. 7, 2006, 10 pp., Paper No. 10.5, IEEE, Los Alamitos, CA.

Deval, Y., et al., "HiperLAN 5.4 GHz Low Power CMOS Synchronous Oscillator," 2001 IEEE Radio Frequency Integrated Circuits Symposium, 2001, pp. 53-56, IEEE, Los Alamitos, CA.

Ismail, A., et al., "A 3.1 to 8.2GHz Direct Conversion Receiver for MN-OFDM UWB Communications," 2005 IEEE International Solid-State Circuits Conference, Session 11: Ultra Wideband Solutions, Feb. 8, 2005, pp. 208-209, 593, Paper No. 11.5, IEEE, Los Alamitos, CA.

Ismail, A., et al., "A 3.1- to 8.2-GHz Zero-IF Receiver and Direct Frequency Synthesizer in 0.18-μm SiGe BiCMOS for Mode-2 MB-OFDM UWB Communication," IEEE Journal of Solid-State Circuits, Dec. 2005, pp. 2573-2582, vol. 40, No. 12, IEEE, Los Alamitos, CA.

Lee, T.-C., et al., "A DLL-Based Frequency Multiplier for MBOA-UWB System," 2005 Symposium on VLSI Circuits Digest of Technical Papers, 2005, pp. 42-45, IEEE, Los Alamitos, CA.

Razavi, B., et al., "A UWB CMOS Transceiver," IEEE Journal of Solid-State Circuits, Dec. 2005, pp. 2555-2562, vol. 40, No. 12, IEEE, Los Alamitos, CA.

Tiebout, M., "A CMOS Direct Injection-Locked Oscillator Topology as High-Frequency Low-Power Frequency Divider," IEEE Journal of Solid-State Circuits, Jul. 2004, pp. 1170-1174, vol. 39, No. 7, IEEE, Los Alamitos, CA.

* cited by examiner

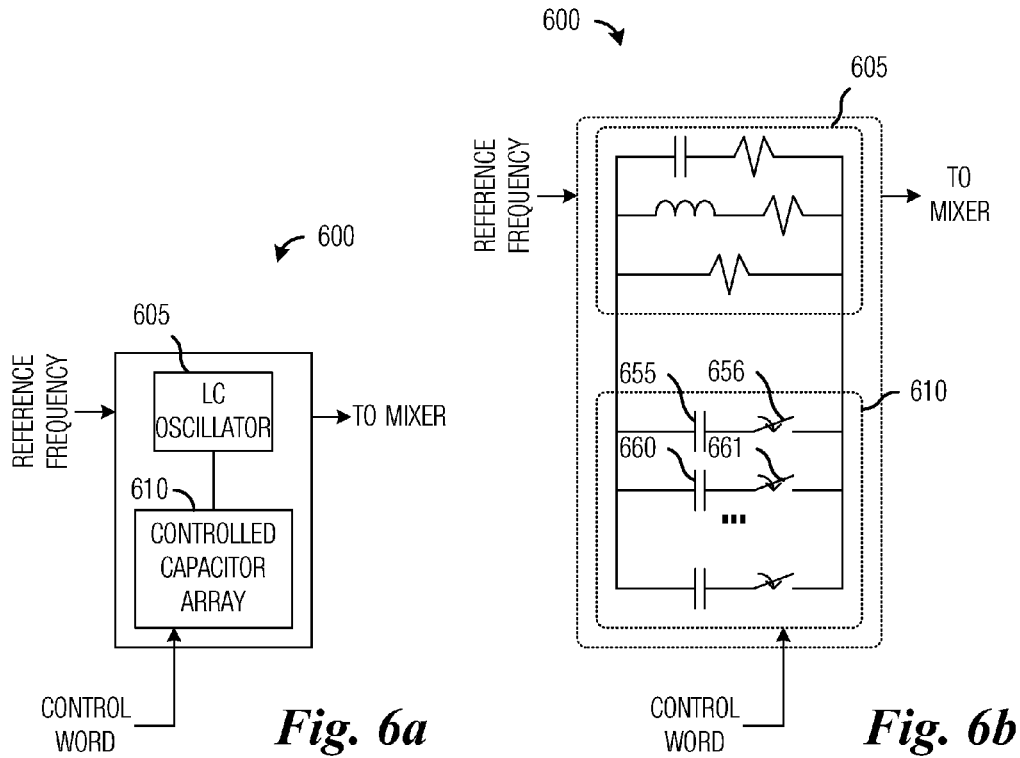
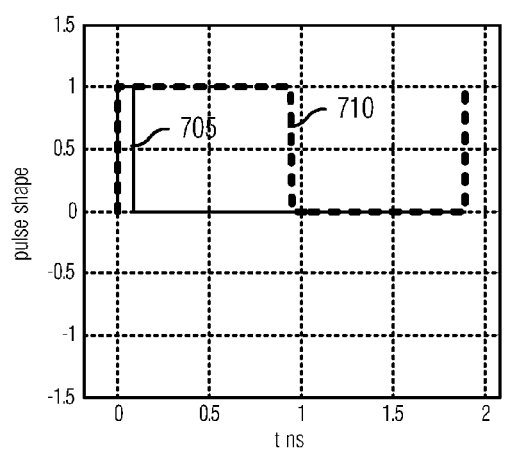
*Fig. 7a*
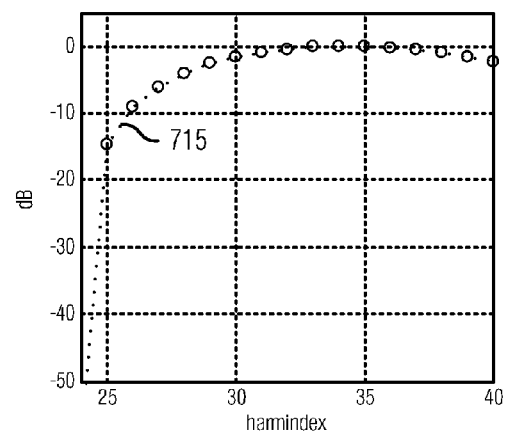
*Fig. 7b*

US 7,940,830 B2

FAST HOPPING FREQUENCY SYNTHESIZER

TECHNICAL FIELD

The present invention relates generally to apparatus and systems for wireless communications systems, and more particularly to apparatus and systems for synthesizing frequencies for use in a fast hopping wireless communications system.

BACKGROUND

Many wireless communications systems utilize spread spectrum communications techniques in an attempt to help increase the interference immunity, thereby improving overall performance. Spread spectrum communications techniques use more data bandwidth than necessary to increase a probability of successful data transmission while potentially reducing the impact of the data transmission on other communications systems operating in the vicinity. For example, in a frequency hopping spread spectrum wireless communications system, transmissions from a sender to a receiver occur over a series of frequency bands, wherein at any given time, the transmission occupies a subset of the frequency bands available to transmit data in the wireless communications system. Both the sender and the receiver know which frequency bands are being used so that the receiver may listen in on the frequency bands used to carry the transmission.

Since the transmission may take place over a number of frequency bands, it may be unlikely that an interferer can damage the transmission in its entirety. Furthermore, if some other communications system is operating in the vicinity, the changing frequency bands used in the transmission may minimize the impact of the transmission on the other communications system should the transmission interfere with the operation of the other communications system.

Frequency synthesizers in the sender and the receiver may be used to generate reference frequencies at about the center of each of the frequency bands, permitting the transmitting and the receiving of the transmission. However, in fast hopping communications systems, the frequency synthesizers may be required to change frequencies very quickly, sometimes on the order of nano-seconds. This may exceed the capabilities of many forms of frequency synthesizers.

One technique used to overcome the fast frequency switching requirement is to use multiple frequency synthesizers, with each frequency synthesizer configured to produce a reference frequency at about the center of each frequency band. For example, phase-locked loops (PLL) may be used to produce the reference frequencies required. Another technique utilizes a fixed frequency mode synthesizer in combination with a single-side-band (SSB) mixer.

One disadvantage of the prior art is that phase-locked loops may be physically large, therefore, a large number of PLLs may consume a disproportionate amount of space. This may lead to a larger than desired electronic device.

Yet another disadvantage of the prior art is that PLLs may consume a large amount of current. This may be especially true when multiple PLLs are in simultaneous operation, which may be necessary to meet the fast hopping requirements. The additional power consumption of the PLLs may require a larger power supply (a battery in a wireless electronic device) or a shorter device runtime or both.

A disadvantage of the prior art is that the fixed frequency mode synthesizer in combination with an SSB mixer may have high current consumption, may require a large number of signal traces, and may cause a lot of unwanted output spurs.

SUMMARY OF THE INVENTION

These and other problems are generally solved or circumvented, and technical advantages are generally achieved, by preferred embodiments of the present invention which provides apparatus and systems for synthesizing frequencies for use in a fast hopping wireless communications system.

In accordance with a preferred embodiment of the present invention, a frequency synthesizer for use in a fast frequency hopping communications device is provided. The frequency synthesizer includes a plurality of oscillators, each oscillator having a first input coupled to a reference clock frequency signal, and a signal selector having a control signal input and a plurality of reference clock inputs, each reference clock input coupled to an output from an oscillator in the plurality of oscillators. The oscillator produces a reference frequency that is a harmonic of a reference clock frequency of the reference clock frequency signal, and the signal selector couples a reference clock input to an output based on a control signal provided by the control signal input.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6a and 6b are diagrams of a digitally controlled frequency synthesizer;

FIGS. 7a and 7b are diagrams of a single period of a tuning signal containing both even and odd harmonics of a reference clock frequency and a spectral plot of the tuning signal;

Figure 12:
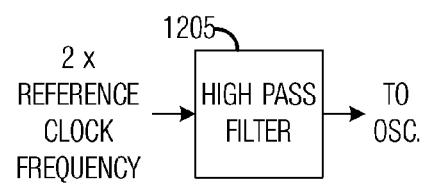
Figure 11A:
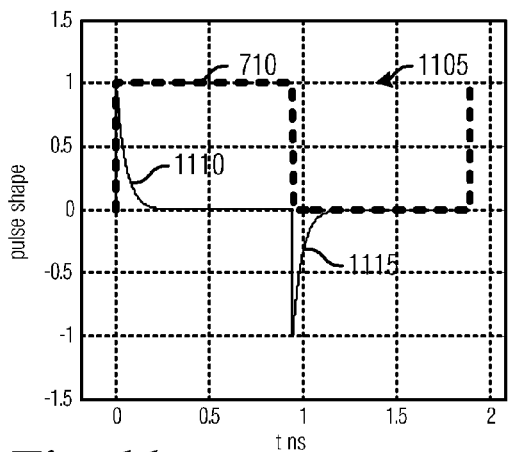
Figure 11B:
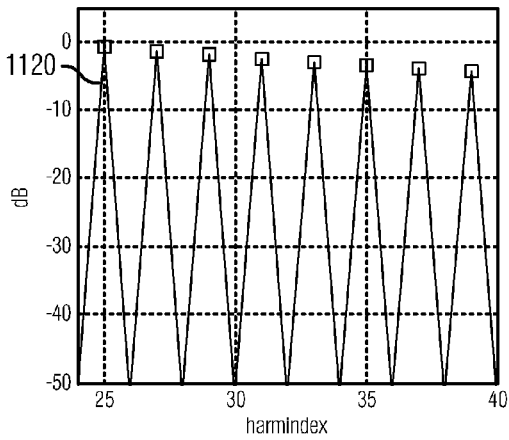

10a and 10b are diagrams of a single period of a tuning signal containing only even harmonics of a reference clock frequency and a spectral plot of the tuning signal;

FIGS. 11a and 11b are diagrams of a single period of a tuning signal containing only odd harmonics of a reference clock frequency and a spectral plot of the tuning signal; and FIG. 12 is a diagram of a high pass filter.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a fast hopping orthogonal frequency division multiplex (OFDM) wireless communications system as specified by the WiMedia technical specifications. The invention may also be applied, however, to other fast hopping spread spectrum wireless communications systems.

Figure 1A:
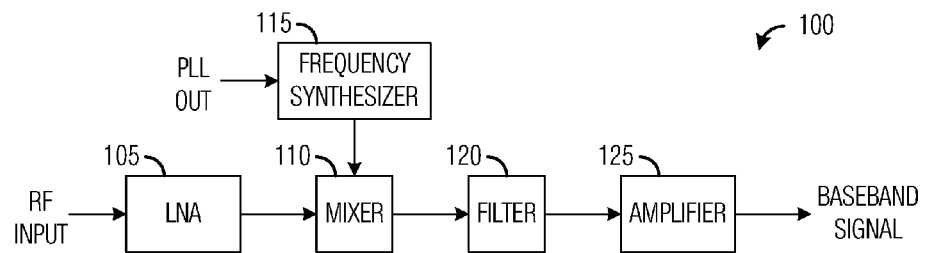
FIG. 1a is a diagram of a receiver for use in a fast hopping communications system.

With reference now to FIG. 1a, there is shown a diagram illustrating a portion of a receiver 100 for use in a frequency hopping wireless communications system. The receiver 100 includes a low-noise amplifier (LNA) 105 that may be used to amplify a radio frequency (RF) signal provided at an RF input to a level that is compatible to circuitry in a remainder of the receiver 100. The RF signal may correspond to transmissions made over-the-air and detected by an antenna.

The amplified signal from the LNA 105 may then be provided to a mixer 110. The mixer 110 may be used perform frequency conversion. For example, the mixer 110 may be used to take electrical signals containing information carried at a first frequency (commonly referred to as a carrier frequency) and change it to information carried at a second frequency (commonly referred to a reference frequency). The reference frequency may be provided by a frequency synthesizer 115. For example, electrical signals modulated on a carrier frequency of 3.4 GHz may be mixed down to a reference frequency provided by the frequency synthesizer 115. If the reference frequency provided by the frequency synthesizer 115 is substantially equal to the carrier frequency, then the mixer 110 may effectively remove the carrier frequency.

Figure 1B:
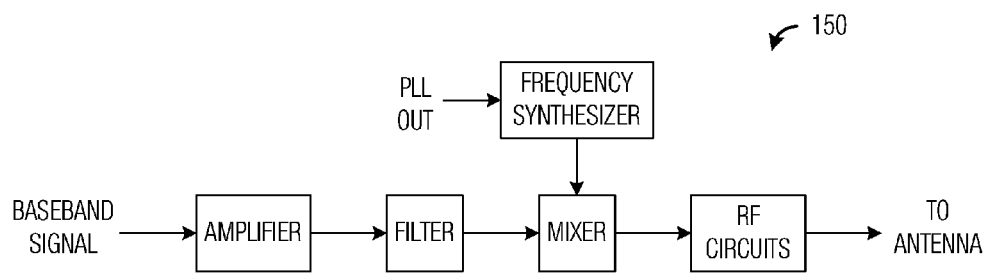
FIG. 1b is a diagram of a transmitter for use in a fast hopping communications system.

The amplified signal, after mixing by the mixer 110, to remove the carrier frequency, for example, may be provided by a filter 120 to eliminate extraneous signals that may reside outside of a frequency band of interest. The filtered signal may then be amplified by an amplifier 125 to produce a baseband signal that may receive additional processing, such as conversion into the digital domain, demodulation, error detection and correction, decoding, and so forth. FIG. 1b illustrates a diagram of a portion of a transmitter 150 for use in a frequency hopping wireless communications system.

Figure 2:
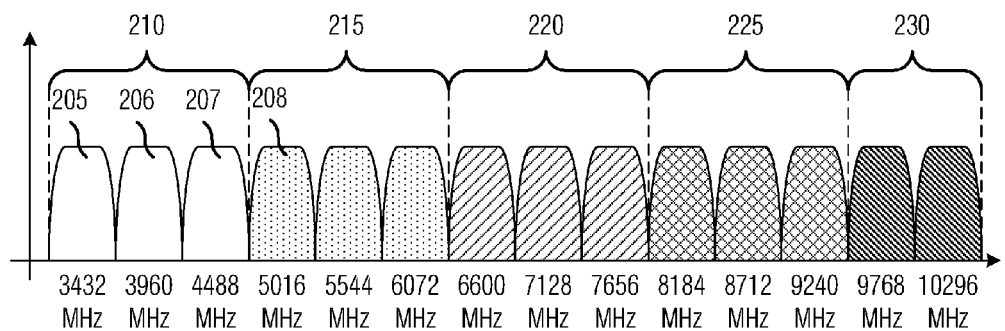
FIG. 2 is a diagram of a frequency allocation map of a fast hopping OFDM wireless communications system as defined by the WiMedia technical specifications.

FIG. 2 illustrates a frequency allocation map of a fast hopping OFDM wireless communications system as specified by the WiMedia technical specifications. The available transmission bandwidth in a WiMedia compliant OFDM wireless communications system may be partitioned into a number of frequency bands, such as frequency bands 205-208, with each frequency band having a different center frequency. For example, frequency band 205 may have a 3432 MHz center frequency, while frequency band 206 may have a 3960 MHz center frequency. Each frequency band is about 528 MHz away from its neighboring frequency band. A number of frequency bands may be grouped together into frequency band groups. For example, frequency bands 205-207 may be grouped into frequency band group 210. Frequency band groups 215-230 may contain groupings of other frequency bands.

In order to transmit or receive transmissions that may occur over multiple frequency bands, a transmitter or a receiver may be required to have a frequency synthesizer, such as the frequency synthesizer 115 of the receiver 100, that is capable of producing reference frequencies that correspond to each of the frequency bands. For example, if a receiver is receiving transmissions over frequency band group 210, a frequency synthesizer of the receiver should be capable of producing reference frequencies at about 3432 MHz, 3960 MHz, and 4488 MHz.

A common requirement of frequency hopping wireless communications systems, especially fast hopping wireless communications systems, may be that a settling time of the frequency synthesizer be small. In a WiMedia compliant system, a settling time of less than nine (9) nano-seconds is required. With such a short settling time, it may be impractical to use a single synthesizer that may be switched to a desired reference frequency as needed, since it may not be possible for the single synthesizer to switch and produce a stable reference frequency within the time restriction.

Figure 3A:
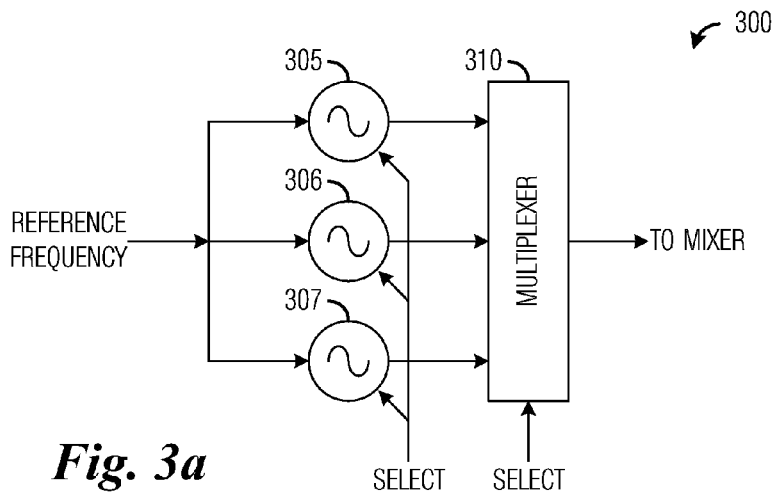
FIGS. 3a through 3c are diagrams of embodiments of a frequency synthesizer.

FIG. 3a illustrates an embodiment of a frequency synthesizer 300 for use in a fast hopping wireless communications system, such as a WiMedia compliant communications system. The frequency synthesizer 300 may be used in the receiver 100 shown in FIG. 1, for example. The frequency synthesizer 300 includes one injection locked oscillator (ILO) per reference frequency to be produced by the frequency synthesizer 300. An ILO, an oscillator with a free running frequency $f_0$, may be injected with an input signal with frequency $n*f_1$. The input signal may also be referred to as a tuning signal. If the frequency $n*f_1$ (with n being a positive integer number) is close to the frequency $f_0$, and if input signal has sufficient magnitude, the oscillator will run at the frequency $n*f_1$ rather than the frequency $f_0$. The closeness of the frequency $n*f_1$ to the frequency $f_0$ as well as the magnitude of the input signal required to have the oscillator run at the frequency $n*f_1$ may be dependent on the topology of the oscillator. ILOs are considered to be well understood by those of ordinary skill in the art of the present invention and will not be discussed further herein. In an alternate embodiment, a frequency multiplier may be used in place of an ILO.

As shown in FIG. 3a, the frequency synthesizer 300 includes three ILOs 305-307. Therefore, the frequency synthesizer 300 may be capable of producing three reference frequencies and may be used in a receiver or a transmitter of a WiMedia compliant communications system utilizing frequency band group 210, for example. The ILOs 305-307 may be coupled to an output of a PLL configured to produce a reference clock signal. For example, for a WiMedia compliant communications system, the reference clock signal may have a frequency of 264 MHz, a common frequency for the frequency bands used in a WiMedia compliant communications network. Output from the ILOs 305-307 may be provided to a multiplexer 310, which may select one of the three reference frequencies to provide to a mixer, such as the mixer 110 shown in FIG. 1.

As an example, if a receiver containing the frequency synthesizer 300 is used in a WiMedia compliant communications system utilizing frequency band group 210, then ILO 305 may be configured to produce a reference frequency of 3432 MHz (13 times the frequency of the reference clock signal), ILO 306 may be configured to produce a reference frequency of 3960 MHz (15 times the reference clock signal), and ILO 307 may be configured to produce a reference frequency of 4488 MHz (17 times the reference clock signal).

Figure 3B:
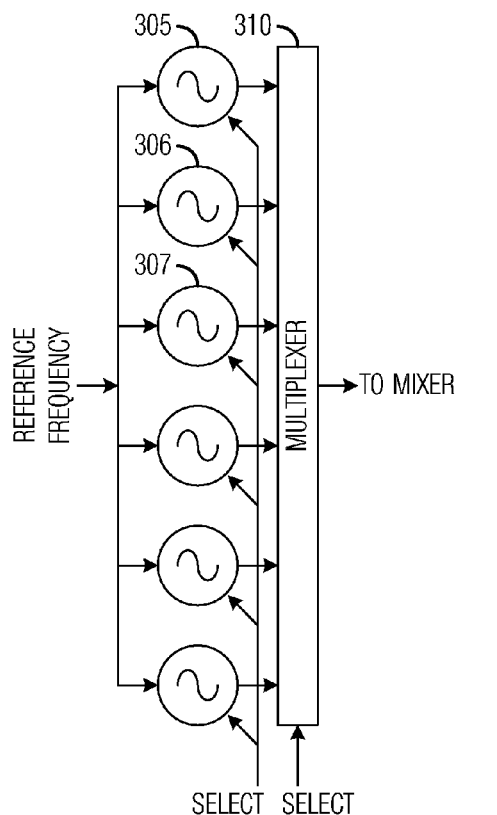
Figure 3C:
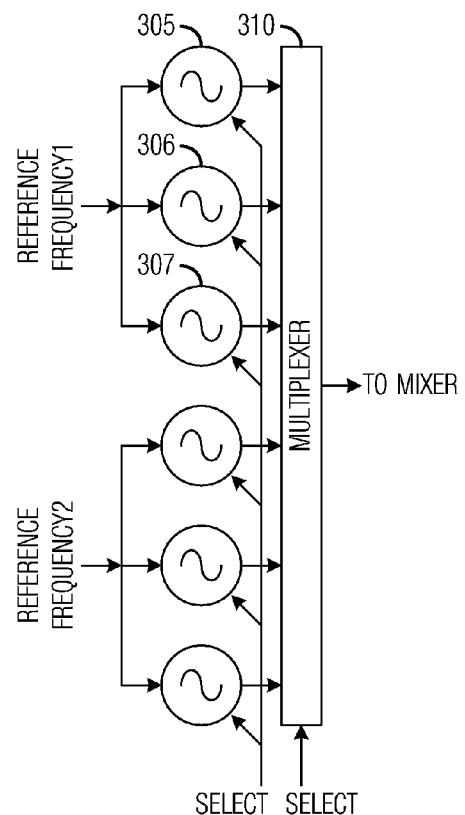

Should the frequency synthesizer 300 be required to produce more than three reference frequencies, additional ILOs may be added. For example, if a receiver containing the frequency synthesizer 300 receives transmissions from the frequency band group 225 in addition to the frequency band group 210, three additional ILOs may be added to the frequency synthesizer 300. Since the frequency bands in the frequency band group 210 share a common frequency with the frequency bands in the frequency band group 225, the additional ILOs may be coupled to the same PLL output as the ILOs 305-307, as shown in FIG. 3b, for example. However, if additional frequency bands use different common frequencies, then the additional ILOs may be coupled to different PLL outputs as needed, as shown in FIG. 3c, for example.

Figure 4:
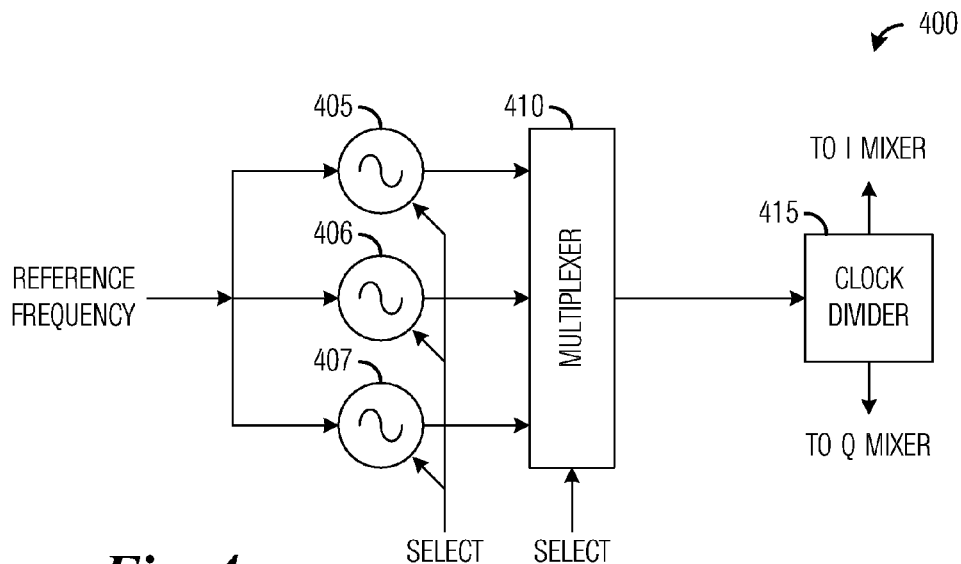
FIG. 4 is a diagram of a frequency synthesizer for use with quadrature modulation/demodulation.

FIG. 4 illustrates an embodiment of a frequency synthesizer 400 for use in a fast hopping wireless communications system, such as a WiMedia compliant communications system. Some communications systems use quadrature (IQ) modulation wherein two reference frequencies that are typically 90 degrees out of phase are used as carrier frequencies. The frequency synthesizer 400 shown in FIG. 4 may be used to generate three reference frequencies, with each reference frequency comprising two signals that are 90 degrees out of phase with each other. The frequency synthesizer 400 may be similar to the frequency synthesizer 300 shown in FIG. 3, with three ILOs 405-407 with an input coupled to a PLL output.

However, PLL output coupled to the frequency synthesizer 400 may have a reference clock signal that is about twice the frequency of the reference clock signal coupled to the frequency synthesizer 300. For example, in a WiMedia compliant communications system, the PLL output coupled to the frequency synthesizer 400 may be at about 528 MHz while the PLL output coupled to the frequency synthesizer 300 may be at about 264 MHz.

The frequency synthesizer 400 shown in FIG. 4 includes three ILOs 405-407. Therefore, the frequency synthesizer 400 may be capable of producing three reference frequencies. For use in a WiMedia compliant communications device transmitting or receiving in the frequency band group 210, for example, the ILOs 405-407 may be configured to produce a reference frequency that is 13, 15, and 17 times the reference clock signal provided by the PLL output, respectively. A multiplexer 410 may select one of the three reference frequencies produced by the ILOs 405-407 based on a desired reference frequency.

At 13, 15, and 17 times the reference clock signal, the reference frequencies produced by the ILOs 405-407 (6864 MHz, 7920 MHz, and 8976 MHz, respectively) may be about two times greater than desired for frequency bands in the frequency band group 210. A clock divider 415 coupled to an output of the multiplexer 410 may be used to reduce the reference frequency by an appropriate amount to change the reference frequencies produced by the ILOs 405-407 to reference frequencies for frequency bands in the frequency band group 210. For example, the clock divider 415 may be configured to divide the reference frequencies produced by the ILOs 405-407 by a factor of two to produce reference frequencies at 3432 MHz, 3960 MHz, and 4488 MHz, desired reference frequencies for frequency bands in the frequency band group 210.

In addition to dividing the reference frequencies by a specified factor, the clock divider 415 may produce two clock signals that are about 90 degrees out of phase with one another. A first of the two clock signals may be provided to an I mixer and a second of the two clock signals may be provided to a Q mixer.

Although shown with three ILOs, the frequency synthesizer 400 may be implemented with a different number of ILOs, with the number of ILOs being dependent on a number of reference frequencies needed. Furthermore, if different clock reference signals are needed, additional PLL outputs may be used to provide the needed clock reference signals. Additionally, the ILOs may be replaced with frequency multipliers. For example, the frequency synthesizer 400 may be extended in a similar fashion to the frequency synthesizers shown in FIGS. 3b and 3c. Therefore, the discussion of a specific number of ILOs and a single PLL output should not be construed as being limiting to either the scope or the spirit of the present invention.

Figure 5:
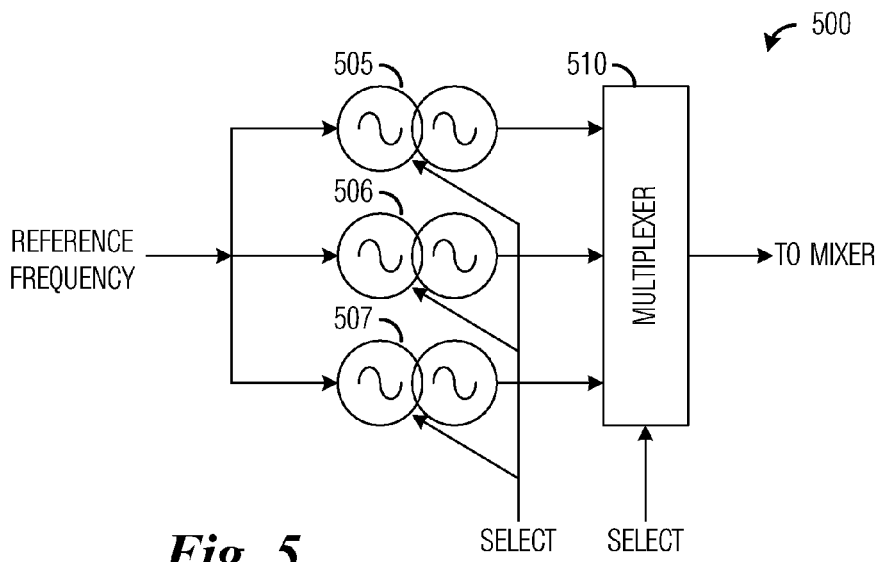
FIG. 5 is a diagram of a frequency synthesizer for use with quadrature modulation/demodulation.

FIG. 5 illustrates an embodiment of a frequency synthesizer 500 for use in a fast hopping wireless communications system, such as a WiMedia compliant communications system. Rather than utilizing a reference clock signal from a PLL output that is a multiple of a common frequency for the frequency bands used in the fast hopping wireless communications system and then a clock divider with an appropriate dividing factor to bring the reference frequencies produced by ILOs back to desired reference frequencies, the frequency synthesizer 500 may make use of quadrature ILOs 505-507. A quadrature ILO may comprise two ILOs that may be injected with an input signal at a desired frequency. Then each ILO in the quadrature ILO may produce a reference frequency substantially equal to the desired frequency, but with a first ILO producing a reference frequency that is 90 degrees out of phase a reference frequency produced by a second ILO, outputting an IQ reference frequency. A multiplexer 510 may be used to select one of the IQ reference frequencies and provide the IQ reference frequencies to an I mixer and a Q mixer.

Although shown with three quadrature ILOs, the frequency synthesizer 500 may be implemented with a different number of quadrature ILOs, with the number of quadrature ILOs being dependent on a number of reference frequencies needed. Furthermore, if different clock reference signals are needed, additional PLL outputs may be used to provide the needed clock reference signals. Additionally, the quadrature ILOs may be replaced with frequency multipliers. For example, the frequency synthesizer 500 may be extended in a similar fashion to the frequency synthesizers shown in FIGS. 3b and 3c. Therefore, the discussion of a specific number of quadrature ILOs and a single PLL output should not be construed as being limiting to either the scope or the spirit of the present invention.

FIG. 6a illustrates a high-level view of an embodiment of a frequency synthesizer 600 for use in a fast hopping wireless communications system, such as a WiMedia compliant communications system. The frequency synthesizer 600 includes an LC oscillator 605 and a controlled capacitor array 610. The LC oscillator 605 may have as an input a reference clock signal provided by a PLL output and an output coupled to a mixer. The controlled capacitor array 610 may be controlled by a control word provided at its input. The controlled capacitor array 610 may appear as capacitance coupled to the LC oscillator 605, with the capacitance depending on a value of the control word. By changing the capacitance of the controlled capacitor array 610, the oscillating frequency of the LC oscillator 605 may be changed. For example, the LC oscillator 605 may produce a first reference frequency when a first control word is provided to the controlled capacitor array 610, which may result in a first capacitance being coupled to the LC oscillator 605. The LC oscillator 605 may produce a second reference frequency when a second control word is provided to the controlled capacitor array 610, which may result in a second capacitance being coupled to the LC oscillator 605, and so forth.

Preferably, the controlled capacitor array 610 may be digitally controlled by an N-bit digital control word. For example, the N-bit control word provided to the controlled capacitor array 610 may be a binary value of a multiplicative ratio of a reference frequency to be provided by the frequency synthesizer 600 divided by the reference clock signal as provided by the PLL output. In a WiMedia compliant communications device communicating in the frequency band group 210, possible N-bit control words may be 13 (01101 binary), 15 (01111 binary), or 17 (10001 binary) with the reference clock signal being about equal to 264 MHz.

The frequency synthesizer 600 may also be modified for use in a fast hopping communications system utilizing IQ signaling by adding a clock divider similar to the clock divider 415 shown in FIG. 4 and increasing the reference clock signal from the PLL output to twice that of the frequency synthesizer 600 used in a fast hopping communications system not utilizing IQ signaling. For example, if the frequency synthesizer 600 used in a fast hopping communications system not utilizing IQ signaling uses a 264 MHz reference clock signal, then the frequency synthesizer 600 used in a fast hopping communications system utilizing IQ signaling may use a 528 MHz reference clock signal.

FIG. 6b illustrates a detailed view of the frequency synthesizer 600. The LC oscillator 605 may be a standard LC oscillator containing capacitors, inductors, and resistors sized so that the LC oscillator 605 may be capable of producing an output signal that spans a desired range of frequencies. The controlled capacitor array 610 includes capacitors, such as capacitor 655 and capacitor 660. Each capacitor in the controlled capacitor array 610 may be selectively coupled to the LC oscillator 605 by a switch, such as switch 656 for the capacitor 655 and switch 661 for the capacitor 660. The state of the switches may be controlled by the control word. For example, a first control word may couple the capacitor 655 to the LC oscillator 605 by closing the switch 656 and opening all other switches in the controlled capacitor array 610. Similarly, a second control word may couple the capacitor 660 to the LC oscillator 605 by closing the switch 661 and opening all other switches in the controlled capacitor array 610. An actual mapping of control word value to switch state may be dependent on factors such as capacitor values, desired capacitance, number of capacitors in the controlled capacitor array 610, desired precision (closeness of actual capacitance to desired capacitance), and so forth.

The frequency synthesizer 115 of the receiver 100 or a transmitter used in a frequency hopping wireless communications system may use an LC tank circuit oscillator capable of locking to a frequency that is a double of a desired frequency and may be followed by a divider circuit used to divide an output of the LC tank circuit by two to provide two quadrature signals at the desired frequency, as shown in FIG. 4. Such a configuration able to operate between 13 and 19 GHz may be used to generate reference frequencies to cover frequency band group 220 (6600 MHz, 7128 MHz, and 7656 MHz) and frequency band group 225 (8184 MHz, 8712 MHz, and 9240 MHz).

Using an ILO with a reference clock signal of 528 MHz, odd harmonics of the reference clock signal may be used to generate the reference frequencies of frequency bands in the frequency band group 220 and 225. If the divider circuit divides the output of the LC tank circuit by four, then even harmonics of the reference clock signal may be used to generate the reference frequencies of frequency bands in the frequency band group 210 (3432 MHz, 3960 MHz, and 4488 MHz). Table 1 below illustrates the harmonics of a reference clock signal required to generate reference frequencies for various frequency band groups.

TABLE 1

Harmonics of reference clock frequency for several frequency band groups.

| | LO Frequency (MHz) | LC Tank Frequency (MHz) | Harmonic × Reference Clock Frequency |
|---|---|---|---|
| Frequency Band Group 220 (LO × 2) | 6600 | 13200 | 25 × 528 |
| | 7128 | 14256 | 27 × 528 |
| | 7656 | 15312 | 29 × 528 |
| Frequency Band Group 225 (LO × 2) | 8184 | 16368 | 31 × 528 |
| | 8712 | 17424 | 33 × 528 |
| | 9240 | 18480 | 35 × 528 |
| Frequency Band Group 210 (LO × 4) | 3432 | 13728 | 26 × 528 |
| | 3960 | 15840 | 30 × 528 |
| | 4488 | 17952 | 34 × 528 |

FIG. 7a illustrates a single period of a tuning signal containing both odd and even harmonics of the reference clock frequency which may be injected into an ILO to allow for the lock onto either the even or the odd harmonics of the reference clock signal as needed. The tuning signal includes a short square pulse 705 and a reference clock signal 710. The reference clock signal 710 may have the desired frequency, for example, 528 MHz. FIG. 7b illustrates a trace 715 showing the spectrum of the tuning signal, containing both even and odd harmonics of the reference clock signal 710.

A disadvantage of using a tuning signal/injecting signal containing both the even and odd harmonics of the reference clock signal may be the presence of a large number of spurious signals at harmonics close to a desired frequency, such as at +/−528 MHz from the desired frequency. For example, to generate a reference frequency of 7656 MHz, the ILO may lock onto the 29th harmonic of the reference clock signal 710. However, the $28^{th}$ and the $30^{th}$ harmonics may generate spurious signals only +/−528 MHz away from the desired frequency. The relative closeness of the spurious signals from the $28^{th}$ and the $30^{th}$ harmonics may present problems meeting stringent spectral emission masks. If only odd harmonics are present in the tuning signal, the $27^{th}$ and the $31^{st}$ harmonics may also generate spurious signals, but they are +/−1056 MHz away from the desired frequency, potentially enabling the filtering of more spurious signals. In other words, the inherent LC-tank of the oscillator 605 may typically provide enough damping to mitigate spurious signals at +/−1056 MHz from the desired frequency.

Figure 8A:
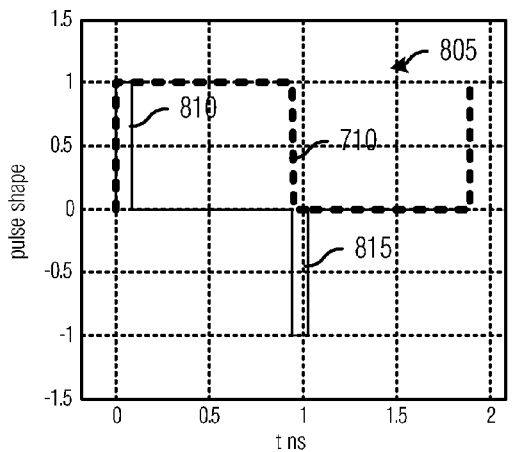
FIGS. 8a and 8b are diagrams of a single period of a tuning signal containing only odd harmonics of a reference clock frequency and a spectral plot of the tuning signal.
Figure 8B:
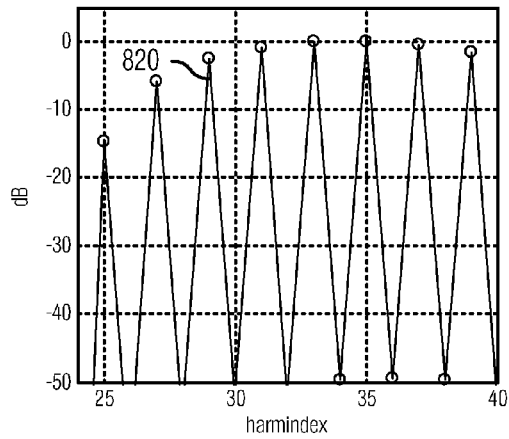

A tuning signal/injecting signal with only even or odd harmonics of the reference clock signal may be injected into an ILO. FIG. 8a illustrates a single period of a tuning signal containing only odd harmonics of the reference clock frequency. The tuning signal includes a signal 805 having a positive pulse 810 and a negative pulse 815. The tuning signal also includes the reference clock signal with the desired frequency of 528 MHz, for example. FIG. 8b illustrates a trace 820 showing the spectrum of the tuning signal, containing only odd harmonics of the reference clock signal 710. One possible way to generate the signal 805 may be to use a pulse generator that may be clocked at two times the reference clock frequency or 1056 MHz and modulate the pulses generated by the pulse generator with an alternating sequence of +1's and −1's, such as +1−1+1−1+1−1 . . . .

Figure 9:
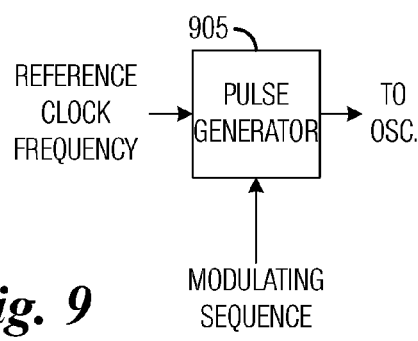
FIG. 9 is a diagram of a pulse generator.

FIG. 9 illustrates a pulse generator 905 that may be used to generate the signal 805. The pulse generator 905 may have as inputs a reference clock frequency signal, for example, a signal with a 1056 MHz frequency, and a modulating sequence, for example, the alternating sequence of +1's and −1's. The pulse generator 905 may then modulate the reference clock frequency signal with the modulating sequence, producing the signal 805. The use of a different modulating sequence may produce a different output.

Figure 10A:
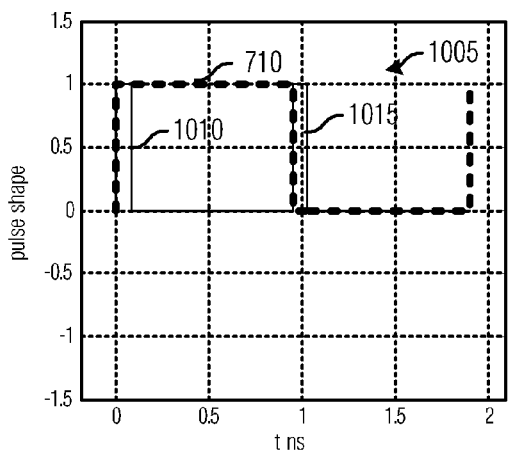
Figure 10B:
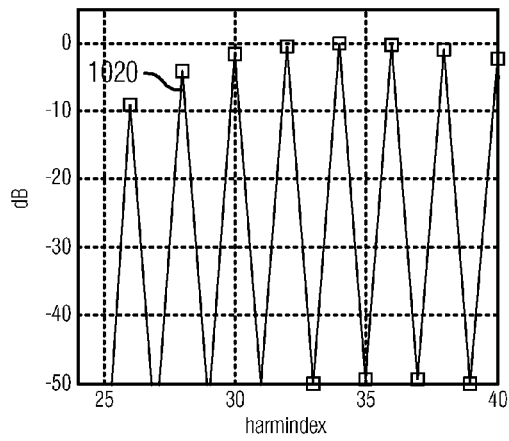

FIG. 10a illustrates a single period of a tuning signal containing only even harmonics of the reference clock frequency. The tuning signal includes a signal 1005 having a first positive pulse 1010 and a second positive pulse 1015. The tuning signal also includes the reference clock signal 710 with the desired frequency of 528 MHz, for example. FIG. 10b illustrates a trace 1020 showing the spectrum of the tuning signal, containing only even harmonics of the reference clock signal 710. One possible way to generate the signal 1005 may be to use a pulse generator that may be clocked at two times the reference clock frequency or 1056 MHz and modulate the pulses generated by the pulse generator with a sequence of +1's, such as +1+1+1+1+1 . . . .

FIG. 11a illustrates a single period of a tuning signal containing only odd harmonics of the reference clock frequency. The tuning signal includes a signal 1105 having a positive pulse 1110 and a negative pulse 1115. The signal 1105 may be created from the reference clock signal 710 by providing the reference clock signal 710 to a high pass filter. The high pass filter effectively AC couples the reference clock signal, producing a signal with a spectrum containing only odd harmonics. FIG. 12 illustrates a high pass filter 1205 usable in producing a signal with a spectrum containing only odd harmonics. With reference back to FIG. 11b, a trace 1120 is illustrated. The trace 1120 shows the spectrum of the tuning signal. An alternate embodiment of a tuning signal with only even harmonics may be a clock with a frequency of 1056 MHz (or two times the reference clock frequency).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A frequency synthesizer for use in a fast frequency hopping communications device, the frequency synthesizer comprising:

a plurality of oscillators, each oscillator having a first input coupled to a reference clock frequency signal, and each oscillator comprising an injection locked oscillator configured to be injection locked to a harmonic of a reference clock frequency of the reference clock frequency signal, wherein a first oscillator of the plurality of oscillators is configured to be injection locked to one harmonic of the reference clock frequency and a second oscillator of the plurality of oscillators is configured to be simultaneously injection locked to a different harmonic of the reference clock frequency; and a signal selector having a control signal input and a plurality of reference clock inputs, each reference clock input coupled to an output from an oscillator in the plurality of oscillators, the signal selector to couple a reference clock input to an output based on a control signal provided by the control signal input.

2. The frequency synthesizer of claim 1, wherein each injection locked oscillator comprises a quadrature injection locked oscillator, the quadrature injection locked oscillator to produce two reference frequencies having substantially equal frequencies that are ninety degrees out of phase.

3. The frequency synthesizer of claim 1, further comprising a clock divider coupled to the output of the signal selector, the clock divider to produce two reference frequencies having substantially equal frequencies that is a reference frequency produced by an oscillator selected by the signal selector divided by n (where n is the divisor of the clock divider), wherein the two reference frequencies are about ninety degrees out of phase.

4. The frequency synthesizer of claim 3, wherein the reference clock frequency signal is an integral multiple of the reference clock frequency, and wherein the integral multiple and n are multiplicative inverses.

5. The frequency synthesizer of claim 1, wherein each oscillator in the plurality of oscillators comprises a frequency multiplier, and wherein each frequency multiplier produces a unique multiple of the reference clock frequency.

6. The frequency synthesizer of claim 1, wherein the fast frequency hopping communications device communicates using several groups of frequency bands, with each group of frequency bands having a different reference clock frequency, wherein the plurality of oscillators is partitioned into several groups of oscillators, one group of oscillators per group of frequency bands, and wherein each group of oscillators is coupled to a different reference clock frequency signal.

7. The frequency synthesizer of claim 1, wherein the reference clock signal frequency signal comprises only even or odd harmonics of the reference clock frequency.

8. The frequency synthesizer of claim 7, further comprising a pulse generator having a reference clock signal input and a modulating sequence input, the pulse generator to modulate the reference clock frequency with a modulating sequence to produce the reference clock frequency signal.

9. The frequency synthesizer of claim 8, wherein the modulating sequence comprises a sequence of alternating a +voltage value and a—voltage value, and wherein the reference clock frequency signal comprises odd harmonics of the reference clock frequency.

10. The frequency synthesizer of claim 8, wherein the modulating sequence comprises a sequence of a +voltage value, and wherein the reference clock frequency signal comprises even harmonics of the reference clock frequency.

11. The frequency synthesizer of claim 7, further comprising a high pass filter coupled to a clock signal input providing a clock signal with a frequency about two times the reference clock frequency.

12. The frequency synthesizer of claim 1, wherein the frequency synthesizer is used in a WiMedia compliant communications device, and wherein the reference clock frequency is about equal to an integer multiple of 264 MHz.

13. The frequency synthesizer of claim 1, wherein each oscillator is an LC oscillator.

14. A fast hopping communications device comprising a receiver to receive transmissions over multiple frequency bands, the receiver comprising:
- a first amplifier coupled to a radio frequency input, the first amplifier to change a signal level of a radio frequency signal provided by the radio frequency input to create an amplified radio frequency signal;
- a frequency synthesizer to produce a receiver reference frequency for a frequency band over which the radio frequency signal is being received, the frequency synthesizer comprising
  - a plurality of oscillators, one oscillator per frequency band, each oscillator coupled to a reference clock frequency signal input, and each oscillator comprising an injection locked oscillator configured to be injection locked to a harmonic of a reference clock frequency signal provided by the reference clock frequency signal input, wherein a first oscillator of the plurality of oscillators is configured to be injection locked to one harmonic of the reference clock frequency and a second oscillator of the plurality of oscillators is configured to be simultaneously injection locked to a different harmonic of the reference clock frequency, and
  - a first signal selector having a first control signal input and a plurality of first reference clock inputs, each first reference clock input coupled to an output from an oscillator in the plurality of oscillators, the first signal selector to couple a reference clock input to an output based on a first control signal provided by the first control signal input;
- a first mixer coupled to the first amplifier and to the frequency synthesizer, the first mixer to remove a carrier frequency at the receiver reference frequency from the amplified radio frequency signal; and
- a first filter coupled to the first mixer, the first filter to eliminate signals outside of a specified frequency range to produce an incoming baseband signal.

15. The fast hopping communications device of claim 14, further comprising a transmitter to transmit transmissions over multiple frequency bands, the transmitter comprising:
- a second amplifier coupled to an outgoing baseband signal input, the second amplifier to change a signal level of an outgoing baseband signal provided by the outgoing baseband signal input;
- a second filter coupled to the second amplifier, the second filter to eliminate signals outside of the specified frequency range to produce a filtered outgoing baseband signal;
- a second signal selector having a second control signal input and a plurality of second reference clock inputs, each second reference clock input coupled to an output from an oscillator in the plurality of oscillators, the second signal selector to couple a second reference clock input to an output based on a second control signal provided by the second control signal input to produce a transmitter reference frequency; and
- a second mixer coupled to the second filter, the second mixer to move the filtered outgoing baseband signal into a frequency band with a center frequency located at about the transmitter reference frequency.

16. The fast hopping communications device of claim 15, wherein the fast hopping communications device is a WiMedia compliant communications device.

17. The fast hopping communications device of claim 14, wherein each oscillator in the plurality of oscillators is an LC oscillator.

18. A frequency synthesizer for use in a fast frequency hopping communications device, the frequency synthesizer comprising:
- a plurality of oscillators, each oscillator having a first input coupled to a reference clock frequency signal, the oscillator configured to produce a reference frequency that is a harmonic of a reference clock frequency of the reference clock frequency signal; and
- a signal selector having a control signal input and a plurality of reference clock inputs, each reference clock input coupled to an output from an oscillator in the plurality of oscillators, the signal selector to couple a reference clock input to an output based on a control signal provided by the control signal input, wherein the fast frequency hopping communications device communicates using several groups of frequency bands, with each group of frequency bands having a different reference clock frequency, wherein the plurality of oscillators is partitioned into several groups of oscillators, one group of oscillators per group of frequency bands, and wherein each group of oscillators is coupled to a different reference clock frequency signal.

* * * * *